United States Patent
Wobben

(10) Patent No.: US 7,928,723 B2
(45) Date of Patent: Apr. 19, 2011

(54) MEASUREMENT OF DISSIPATED POWER

(76) Inventor: Aloys Wobben, Aurich (DE)

( * ) Notice: Subject to any disclaimer, the term of this patent is extended or adjusted under 35 U.S.C. 154(b) by 218 days.

(21) Appl. No.: 11/997,286

(22) PCT Filed: Jul. 28, 2006

(86) PCT No.: PCT/EP2006/007490
§ 371 (c)(1),
(2), (4) Date: Apr. 9, 2008

(87) PCT Pub. No.: WO2007/014713
PCT Pub. Date: Feb. 8, 2007

(65) Prior Publication Data
US 2008/0191686 A1 Aug. 14, 2008

(30) Foreign Application Priority Data
Jul. 29, 2005 (DE) .................. 10 2005 036 317

(51) Int. Cl.
*G01R 11/32* (2006.01)
(52) U.S. Cl. ........................ 324/142; 327/434
(58) Field of Classification Search .................. None
See application file for complete search history.

(56) References Cited

U.S. PATENT DOCUMENTS

| | | | | |
|---|---|---|---|---|
| 4,426,589 A * | 1/1984 | Moder | ............ | 327/412 |
| 5,107,190 A | 4/1992 | Schultz et al. | | |
| 5,172,009 A * | 12/1992 | Mohan | ............ | 307/46 |
| 5,841,262 A | 11/1998 | Tang | | |
| 5,917,382 A * | 6/1999 | Chiozzi | ............ | 330/298 |
| 6,933,625 B2 * | 8/2005 | Feddersen et al. | ............ | 290/44 |
| 7,737,761 B2 * | 6/2010 | Ishikawa et al. | ............ | 327/380 |
| 2002/0079706 A1 | 6/2002 | Rebsdorf et al. | | |
| 2004/0085117 A1 | 5/2004 | Melbert et al. | | |
| 2004/0125523 A1 | 7/2004 | Edwards et al. | | |
| 2004/0196678 A1 | 10/2004 | Yoshimura et al. | | |
| 2005/0017707 A1* | 1/2005 | Ramesh et al. | ............ | 324/102 |

FOREIGN PATENT DOCUMENTS

| | | |
|---|---|---|
| DE | 1005181 | 3/1957 |
| DE | 3526836 A1 | 1/1987 |
| DE | 3905701 A1 | 6/1989 |
| DE | 19824064 A1 | 12/1999 |
| DE | 10141125 A1 | 6/2002 |
| DE | 10127776 A1 | 1/2003 |

(Continued)

OTHER PUBLICATIONS

Munk-Nielsen, S., et al., "Simulation with Ideal Switch Models Combined with Measured Loss Data Provides a Good Estimate of Power Loss.", Industry Applications Conference, 2000. Conference Record of the 2000 IEEE Oct. 8-12, 2000, Piscataway, NJ, USA, IEEE, Bd. 5, Oct. 8, 2000.

(Continued)

*Primary Examiner* — Ha Tran T Nguyen
*Assistant Examiner* — Arleen M Vazquez
(74) *Attorney, Agent, or Firm* — Seed IP Law Group PLLC

(57) ABSTRACT

The invention concerns a method of determining the dissipated power of an electronic switch. According to the invention it is proposed that the instantaneous value of a physical quantity is detected, a value correlated with the instantaneous value is polled from a first memory, the two values are processed together in a predetermined manner and the result of the processing operation is outputted.

12 Claims, 6 Drawing Sheets

FOREIGN PATENT DOCUMENTS

| | | |
|---|---|---|
| DE | 10151575 A1 | 5/2003 |
| DE | 10319354 A1 | 11/2004 |
| EP | 0397514 B1 | 9/1994 |
| WO | 9919974 | 4/1999 |
| WO | 0207315 A1 | 1/2002 |
| WO | 02080343 A1 | 10/2002 |
| WO | 03065567 A1 | 8/2003 |
| WO | 2004012326 A1 | 2/2004 |

OTHER PUBLICATIONS

Hiraki, E., et al., "Practical Power Loss Analysis Simulator of Soft Switching and Hard Switching PWM Inverters and Performance Evaluations", Communications, Circuits and Systems and West Sino Expositions, IEEE 2002 International Conference on Jun. 29-Jul. 1, 2002, Piscataway, NJ, USA, IEEE, Bd. 2, Jun. 29, 2002.

* cited by examiner

MEASUREMENT OF DISSIPATED POWER

TECHNICAL FIELD

The present invention concerns a method of and an apparatus for determining the dissipated power of an electronic switch. The invention further concerns an inverter and a method of controlling an inverter and a wind power installation.

DESCRIPTION OF THE RELATED ART

The following documents are known as state of the art: US No 2004/0196678 A1, US No 2004/0125523 A1, U.S. Pat. No. 5,841,262 A, US No 2004/0085117 A1, DE 101 41 125 A1, DE 103 19 354 A1, DE 35 26 836 A1, DE 39 05 701 A1, EP 0 397 514 A2, WO 02/080343 A1, WO 2004/012326 A1, WO 03/065567 A1 and WO 02/07315 A1.

Inverters currently in use frequently use switches in the form of what are referred to as IGBTs in order to produce an alternating current from a direct current, the structure of such inverters being known per se. The switches quite inevitably suffer from switching losses which can be calculated on the basis of known formula. It is to be noted in that respect that free-wheeling diodes associated with an IGBT are also to be included within the term 'switch'.

In designing an inverter therefore the operating parameters can be defined and used as the basis for calculation. So that calculation and reality are in conformity, those parameters must be maintained during operation of the inverter.

In practice, control of the inverter is frequently effected with the switch temperature being monitored. That control is based on the fact that the switches increase in temperature due to the losses and thus the increase in temperature is a measurement of such losses. If temperature monitoring detects that a predetermined threshold value is exceeded, the inverter is then switched off in order to avoid damage. Added to that is the fact that such switches which are constructed of semiconductors react sensitively to thermal overloading. The higher the thermal loading of such a switch, the correspondingly greater is its thermal ageing and the correspondingly earlier it has to be accordingly replaced.

If such an inverter is used in a wind power installation a consequence of the inverter being switched off is that the wind power installation also has to be shut down.

In order to be able to measure dissipation power it is necessary for example to measure the collector-emitter voltage when the IGBT is in the forward state. That is of a value in the lower single-digit range and must be detected as accurately as possible in order to achieve a sufficiently accurate result when dealing with very high currents (several hundreds of amperes). In the off state however the full intermediate circuit voltage (several hundred volts) is applied to those terminals.

BRIEF SUMMARY

Therefore one goal of the present invention is to be able to determine the dissipated power actually occurring in a switch.

In accordance with the invention, a method of determining the dissipated power of an electronic switch includes detecting the instantaneous value of a physical quantity, then a value correlated with the instantaneous value is polled from a first memory, the two values are processed together in a predetermined manner and the result of the processing operation is outputted.

In that respect the invention is based on the realization that values which are associated with a measurement value ascertained by measurement can be taken from the known data of the switch, which are published in data sheets. In the present example, in the case of a known current through the switch it is possible to ascertain for example the collector-emitter voltage (Vce) from the data sheet. Multiplication of the current flowing, by that collector-emitter voltage gives the dissipation power for the current which is instantaneously flowing through the switch. That also involves the switching losses when the switch is switched on and off.

In order to be able to determine the dissipated power not only of a switch but of a complete inverter, a development of the invention provides that the physical quantities of a plurality of switches are detected and a corresponding plurality of correlated values is read out of the memory.

Particularly preferably the measurement results and the intermediate values of processing are stored. By virtue of that feature it is also possible later to have access to those values, for example for statistical evaluations or the like.

For carrying out the invention there is provided an apparatus for determining the dissipated power of an electronic switch, characterized by a data input for detection of the instantaneous value of at least one physical quantity of the electronic switch, a first memory in which data correlated with the physical quantities are stored, a processing unit for processing the physical quantity and a value called up from the memory in predetermined fashion with each other, and a device for outputting the result of the processing operation.

This solution according to the invention enjoys the advantage that it is possible to determine the actual dissipated power of a switch. That is not only dependent on the current flowing and the characteristic values of the switch. Rather, ambient influences such as for example ambient temperature also play a part. Therefore the apparatus according to the invention makes it possible to detect the actual dissipated power at a desired moment in time. In that way therefore it is possible to determine the actual loading of the switch much more accurately than with the computational prognosis procedures known in the state of the art.

In a preferred development the apparatus includes a plurality of inputs for detection of the instantaneous values of the physical quantities of a plurality of switches. In that way it is possible to use the apparatus to detect the dissipated power for example of an entire inverter.

In order to be able to evaluate the variation in the dissipated power over a prolonged period of time, a particularly preferred feature provides a second memory for storing measurement values and intermediate results. That memory however can also be structurally combined with the first memory.

As electronic switches have predetermined limit values for operation thereof, beyond which they should not be operated, the apparatus is preferably characterized by a device for comparing the result of the processing operation with a predetermined limit value and outputting a signal when the limit value is reached or exceeded. In that case the apparatus can advantageously be in the form of an autonomous unit which if required can be easily transported to the respective location of use. Alternatively the apparatus can also be integrated into the control of an inverter or a wind power installation.

Besides the output of the signal which can be used for notifying for example an operator or an operating organization of such a unit the signal can particularly preferably also be outputted to the control of the inverter or the wind power installation to influence the control in a predetermined fashion.

In the case of an inverter operating in accordance with the tolerance band process, that influence can advantageously provide that the tolerance band width is increased if the apparatus outputs a signal which indicates the limit value has been exceeded. If therefore the dissipated power of a switch is excessively high the tolerance band width can be enlarged. That means that the switching frequency and therewith also the switch-on and switch-off losses and consequently overall the dissipated power of the switch (including the free-wheeling diodes) falls.

In a particularly preferred feature a wind power installation is fitted with at least one such inverter. In that respect a method of controlling a wind power installation is characterized in that the power generated by the wind power installation is reduced by the signal which specifies that a predetermined limit value has been exceeded. That provides that the power to be processed by the inverter also becomes less and the dissipated power in the switches is correspondingly reduced.

In that respect an apparatus according to the invention can be connected to the control of the wind power installation in order in that way to be able to influence control of the wind power installation directly and not by way of an inverter.

BRIEF DESCRIPTION OF THE SEVERAL VIEWS OF THE DRAWINGS

The invention is described in greater detail hereinafter with reference to the Figures in which.

DETAILED DESCRIPTION

Figure 1:
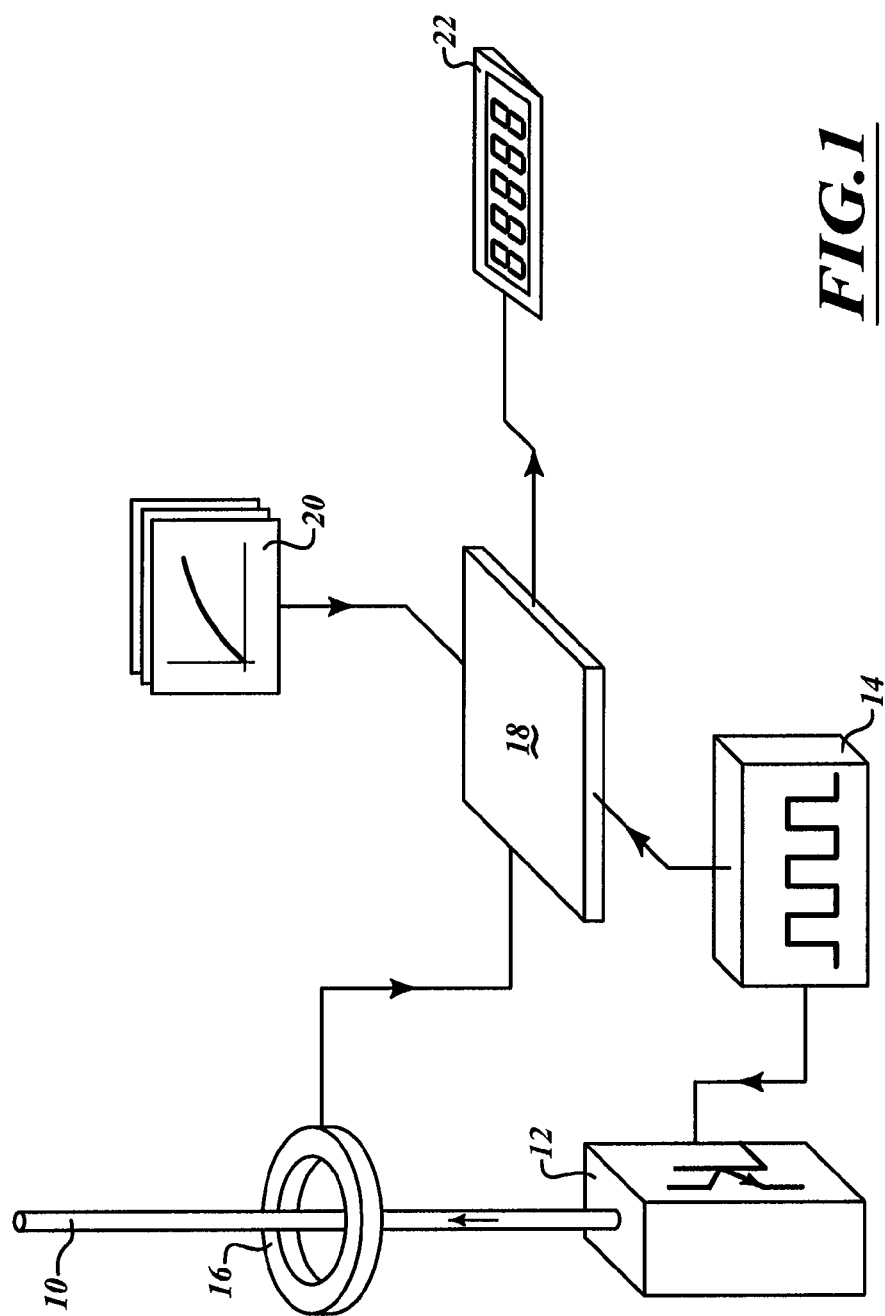
FIG. 1 shows a simplified view of an apparatus according to the invention.

In the simplified view of an apparatus according to the invention as shown in FIG. 1 reference 10 denotes a conductor which is connected to a switch 12 (such as for example an IGBT) and which delivers the alternating current generated. The switch is actuated by a control circuit 14. The current measured in the conductor 10 is detected with a measuring transducer 16 and fed to a processing unit 18. The processing unit 18 also receives actuation information from the control 14 as a trigger event in order to be able to precisely determine the respective switching moments. In accordance with the current ascertained by the measuring transducer 16 in the conductor 10, there is called up from a table 20, a corresponding voltage value for the collector-emitter voltage, and then the actual dissipated power of the switch 12 can be ascertained from those values. The result can be displayed for example on a display 22. It will be appreciated that, in addition to being displayed on display 22, those values can also be stored in a memory (not shown in the Figure) at the same time or prior to being shown on display 22. Using a memory then makes it possible to collect data which can be transferred to a computer for further evaluation purposes, for example, by way of an interface or by processing unit 18.

The processing unit 18 can be a standard microcomputer, microprocessor, or other CPU. It may include within it the control circuit 14 and the memory in which the value of the dissipated power value is stored.

Figure 2:
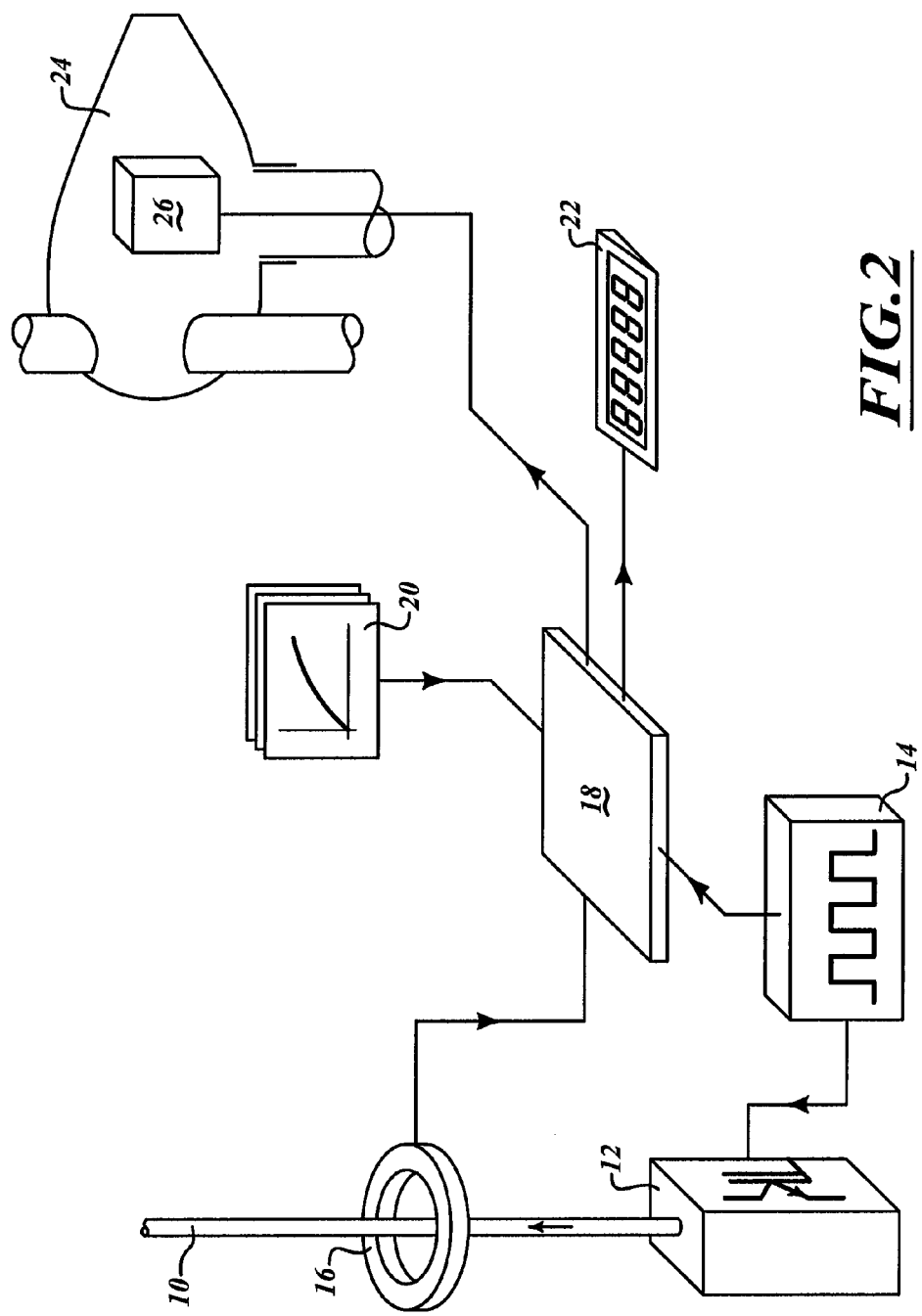
FIG. 2 shows an example of a use of the apparatus in relation to a wind power installation.

The view shown in FIG. 2 substantially corresponds to that of FIG. 1. In addition this Figure shows a pod of a wind power installation 24 with a control 26 provided therein. Thus, depending on the result of the computation operation in the processing unit 18, not only can the computation result be displayed on the display 22, but simultaneously or alternatively the control 26 of the wind power installation 24 can be influenced in order, as one example, to be able to react to a limit value being exceeded. Accordingly the wind power installation can be caused to reduce the power generated to reduce the heating of the switch 12. In the case of pitch-regulated wind power installations that is possible by altering the pitch angle of the rotor blades in known manner.

Figure 3:
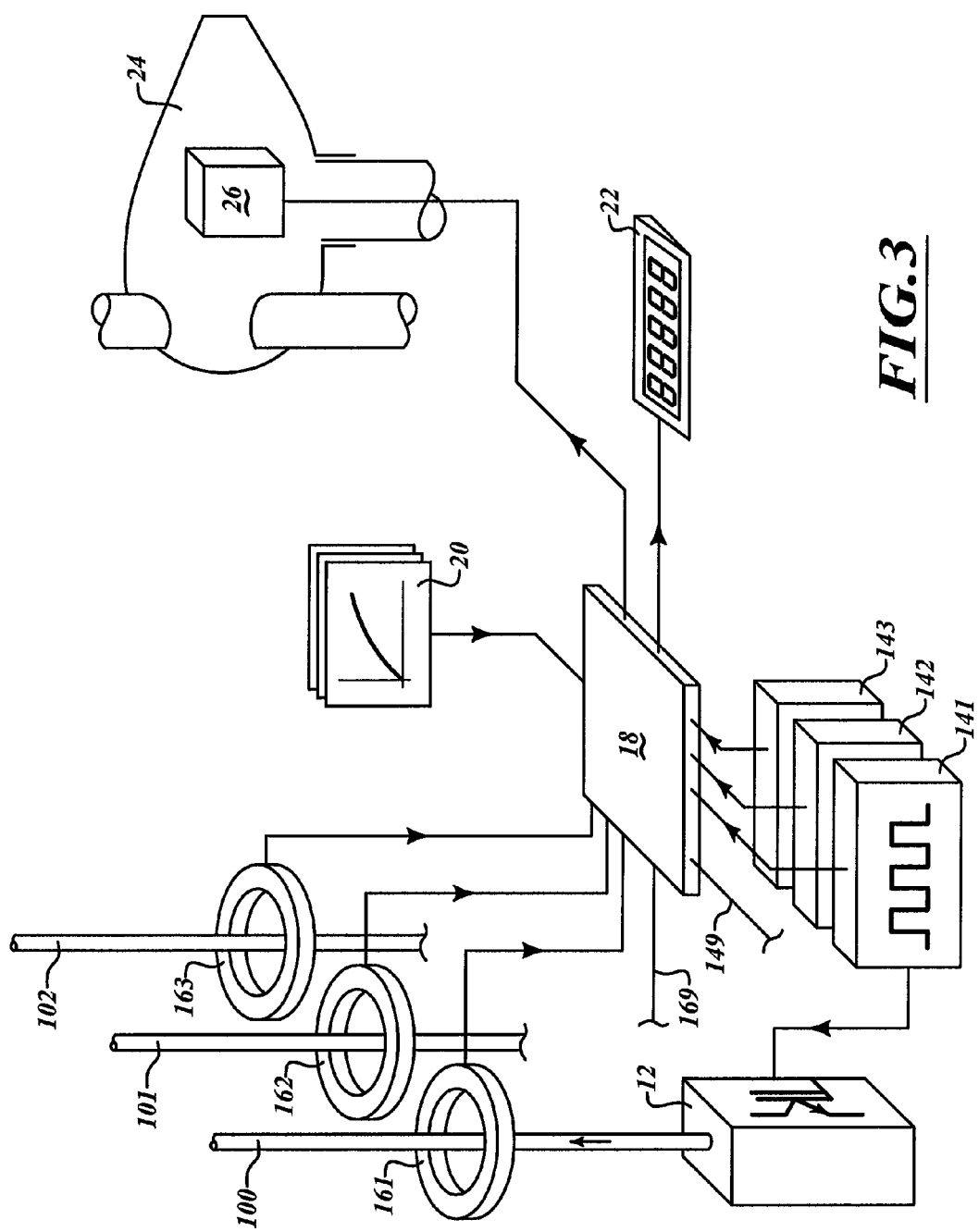
FIG. 3 shows a second example of use of the invention in relation to a wind power installation.

FIG. 3 is supplemented in comparison with FIG. 2 by measuring transducers and actuating arrangements. This Figure shows a plurality of conductors 100, 101, 102 in which the current flowing is detected with measuring transducers 161, 162, 163. The additional switches are not shown, for enhanced clarity of the Figure. A line 169 indicates that here naturally a plurality of measuring transducers can also be connected to the processing unit 16, as an example of detecting a physical quantity.

In accordance with the number of lines, there are also provided corresponding actuating arrangements 141, 142, 143. A line goes from each of those actuating arrangements to the processing unit 18 so that a respective trigger pulse can be delivered for each switch which feeds into one of the lines 100, 101, 102. As described hereinbefore a corresponding value for the collector-emitter voltage of the switch can be called up from the table 20 in relation to each detected current value, and the instantaneous dissipated power can be determined therefrom. The results can then again be outputted to a display 22 or the control 26 of a wind power installation 24. It will be appreciated that it is also possible for corresponding signals of these values to be output and delivered to other devices such as mobile telephones, remote monitoring central stations, the Internet, tracking computers, and so forth in order to trigger corresponding notifications.

Figure 4:
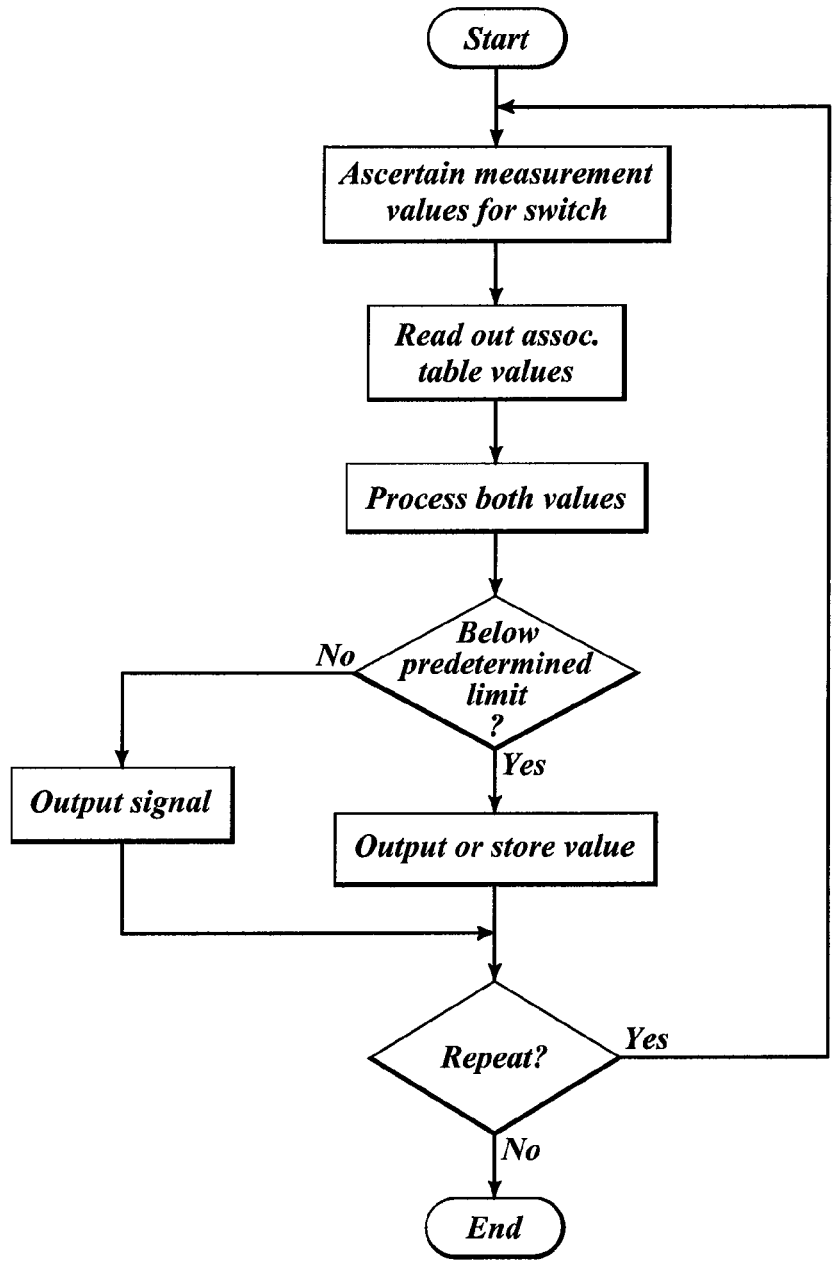
FIG. 4 shows a simplified view of the method according to the invention.

The view in FIG. 4 shows a flow chart for the method according to the invention. After the start the measurement value for a switch is firstly ascertained. On the basis of that measurement value, the next step involves reading the associated data value out of the table and thereafter the two values are processed, in this case therefore multiplied together to ascertain the instantaneous dissipated power of the switch. Thereafter a checking operation can be effected to ascertain whether the value determined is within a predetermined limit. If not a signal can be outputted. It will be appreciated that alternatively or additionally it is also possible to implement a display. The measurement can then be repeated or not. In that respect the repetition can be effected for the same switch or also for another switch.

Figure 5:
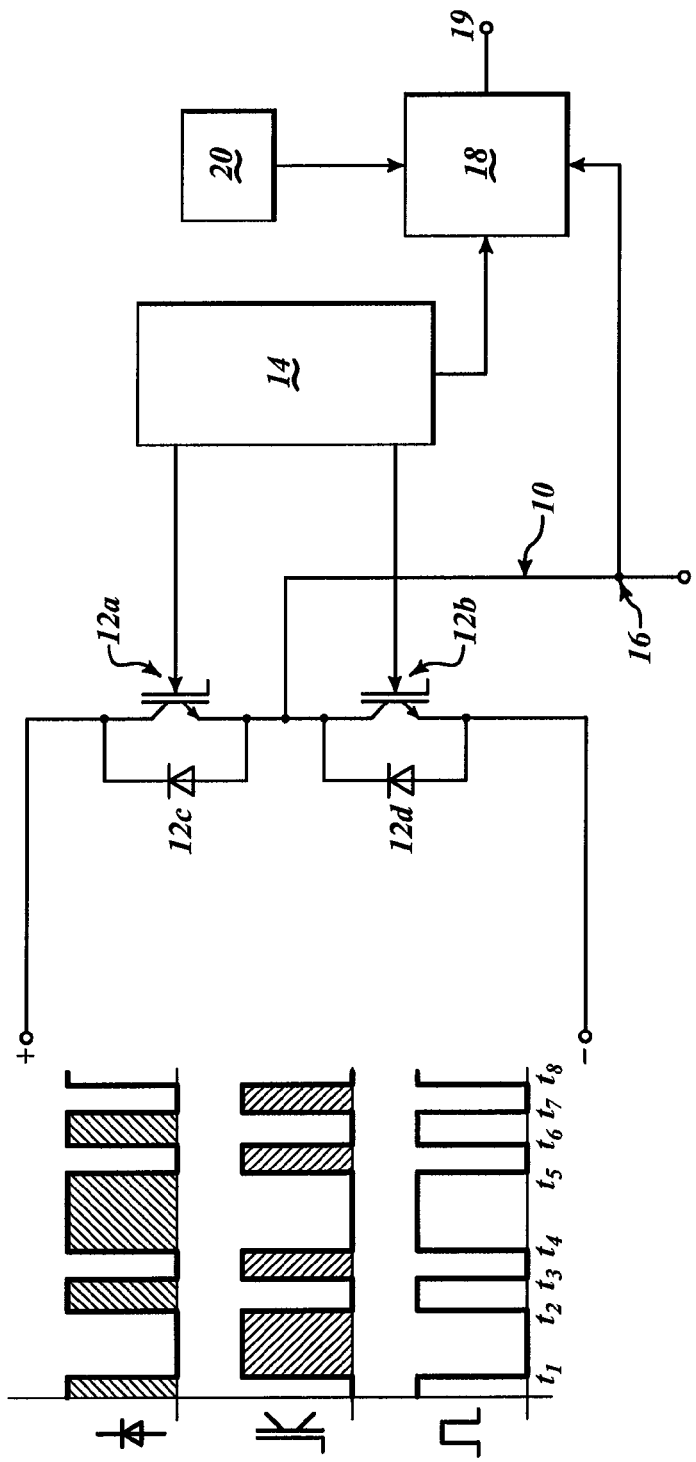
FIG. 5 shows a simplified view of a switch bridge for a phase of an inverter.

FIG. 5 is a simplified view showing the arrangement of two switches 12a and 12b with which the current for a phase can be generated. The free-wheeling diodes 12c and 12d also belong to the switches. The tapping for the phase is disposed in the center between the two switches 12a and 12b and the line 10 corresponds to the line 10 shown in FIGS. 1-3. A measuring transducer 16 detects the current which flows in the line 10 and is fed to a processing unit 18.

A control unit 14 controls the switches 12a and 12b. At the same time it outputs corresponds trigger signals to the processing unit 18. Those trigger signals can involve the actuating clock of the switches 12a and 12b.

The processing unit 18 reads the values associated with the current values, for the collector-emitter voltage, out of the table 20 and outputs the result at an output 19. That output can be for example a display, a memory, a signal to a monitoring means and/or a signal which influences the inverter or the wind power installation.

To understand the following description it is helpful to consider the co-operation of the switch 12a and the free-wheeling diode 12c or the switch 12b and the free-wheeling diode 12d respectively. That is shown in the left-hand part of FIG. 5 by way of example for the switch 12a and the free-wheeling diode 12c. Three switching patterns illustrated one above the other are shown there. The lower switching pattern which is identified at the left-hand edge by a rectangle is assumed to be the switching clock for the IGBT 12a, which is outputted by the control 14. In that respect a falling edge leads to the IGBT being switched on and a rising edge leads to the IGBT being switched off and the free-wheeling diode being switched on. While the clock from the control is at a high level at the beginning, the IGBT is correspondingly switched off and the free-wheeling diode is conducting. Accordingly, flow losses occur there. At the moment in time t1 the control signal has a falling edge. The IGBT is switched on and the diode switched off. Accordingly the flow losses now occur at the switch, as can also be seen in the middle one of the illustrations. For the sake of completeness it should also be mentioned that corresponding leakage losses also occur due to leakage currents in the diode in the off state.

At the moment in time t2 the clock signal has a rising edge. Accordingly the IGBT 12a is switched off and the free-wheeling diode 12c is in a conducting state. At the moment in time t3 the clock signal falls, the IGBT 12a is switched on and the diode is switched off. That is also further shown up to the moment in time t8.

Figure 6:
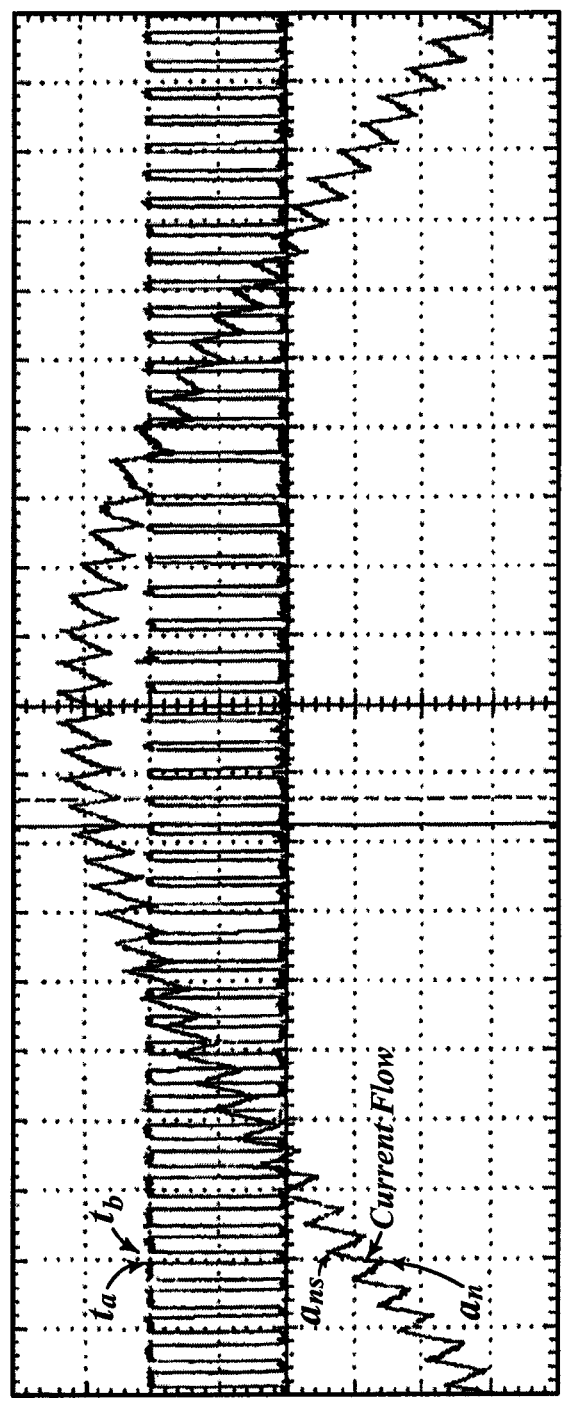
FIG. 6 shows a view of the method according to the invention.

FIG. 6 shows the relationship between the clock pulses which are here once again shown as square-wave pulses, and the current in the conductor 10. At the moment in time ta the clock signal has a falling edge. Accordingly the switch is switched on and the current begins to rise within the tolerance band until the switch switches off at the moment in time tb. That switch-off of the switch 12a leads to the switch 12b switching on and the current falls again somewhat until a lower value is reached. The switch 12a then switches on again, with the falling edge. It will be appreciated that the switch 12b is then switched off and the current rises again. Those switching operations continue until overall a sinusoidal current configuration is produced.

As the switching times depend on the attainment of the corresponding tolerance values the situation does not involve a fixed pattern. Rather those switching times arise precisely out of the attainment of the respective limit values.

While the switch is switched on, at an interval of 25 µs (that value is by way of example, it can also be longer or shorter) the current in the conductor is measured and the corresponding value for the collector-emitter voltage is called up from the table. Accordingly it is possible to precisely determine the loss for the instantaneous current flow.

Overall a distinction is to be drawn between three kinds of losses in respect of the IGBT. At the switching-on moment, switching-on losses occur. They are detected. Equally, at the switching-off moment switching-off losses occur, which are also detected. While the transistor is in the switched-on condition, flow losses occur. They are also detected, and all those values can be cumulated in order thus to arrive at the losses for the IGBT.

Alternately with the current flow through the IGBT a current flow through the diode occurs. This also involves flow losses as well as leakage losses when the diode is in the blocked condition. Those values are also detected, cumulated and combined with the values obtained for the IGBT overall to give the switching losses.

Those switching losses can be ascertained for example for a period of the mains frequency or also for another predeterminable period of time such as for example a second in order then to be able to determine the switching losses for a period or for example for greater ease of convertibility for a second.

In that respect it is possible however to take account not only of the switches of a phase (see FIG. 5). Rather it is also possible to detect the switches for three phases and for the switch for example in a boost converter or in a chopper in the intermediate circuit.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of determining an instantaneous dissipated power of an electronic switch having a free-wheeling diode associated with the electronic switch, the method comprising the steps:

detecting an instantaneous value of a current through the electronic switch;

reading out a collector-emitter voltage associated with the instantaneous value of the current based on data of a data sheet of the electronic switch, the data being stored in a memory;

multiplying the instantaneous value of the current by the collector-emitter voltage in order to determine the instantaneous dissipated power of the electronic switch; and outputting the instantaneous dissipated power, wherein the determined instantaneous dissipated power includes switching losses and flow losses of the electronic switch and flow losses of the free-wheeling diode.

2. The method according to claim 1, wherein currents of a plurality of electronic switches are detected and a corresponding plurality of voltages associated with the currents are read out of the memory.

3. The method according to claim 2, wherein a signal is outputted when the instantaneous dissipated power exceeds a limit value.

4. The method according to claim 1, wherein a signal is outputted when the instantaneous dissipated power exceeds a limit value.

5. The method according to claim 1, wherein the free-wheeling diode is arranged in parallel with the electronic switch.

6. The apparatus according to claim 5, wherein the apparatus is in the form of an autonomous unit.

7. The method of claim 1, further comprising:
outputting a signal that indicates a limit value of the instantaneous dissipated power has been exceeded; and
controlling an inverter which operates in accordance with a tolerance band process including a tolerance band width that is increased based on the signal.

8. An apparatus for determining an instantaneous dissipated power of an electronic switch having a free-wheeling diode associated with the electronic switch, the apparatus comprising:
a data input configured to detect an instantaneous current through the electronic switch,
a first memory configured to store data pertinent to the electronic switch, the data including current and collector-emitter voltage values,
a processing unit configured to multiply the instantaneous current by the collector-emitter voltage value in order to determine the instantaneous dissipated power of the electronic switch, and
an output unit configured to output the instantaneous dissipated power,
wherein the instantaneous dissipated power includes switching losses and flow losses of the electronic switch and flow losses of the free-wheeling diode.

9. The apparatus according to claim 8, wherein currents from a plurality of electronic switches are detected and the collector-emitter voltage values associated with the currents are read out of the memory.

10. The apparatus according to claim 8, further comprising a second memory for storing measurement values and intermediate results.

11. The apparatus according to claim 8 being integrated into a control of an inverter of a wind power installation.

12. The apparatus according to claim 11, wherein an output of a signal to the control of the inverter or the wind power installation to influence control in a predetermined fashion.

\* \* \* \* \*